(12) United States Patent
Fain et al.

(10) Patent No.: US 7,994,785 B2
(45) Date of Patent: Aug. 9, 2011

(54) **METHOD FOR SIMULTANEOUSLY MEASURING T2\* AND DIFFUSION WITH MAGNETIC RESONANCE IMAGING**

(75) Inventors: Sean B Fain, Madison, WI (US); Walter F. Block, Madison, WI (US); James H. Holmes, Madison, WI (US); Rafael L. O'Halloran, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 144 days.

(21) Appl. No.: 12/428,015

(22) Filed: Apr. 22, 2009

(65) Prior Publication Data

US 2009/0273344 A1 Nov. 5, 2009

Related U.S. Application Data

(60) Provisional application No. 61/046,817, filed on Apr. 22, 2008.

(51) Int. Cl.
*G01V 3/00* (2006.01)
(52) U.S. Cl. .................................................... 324/309
(58) Field of Classification Search .......... 324/300–322; 600/407–445
See application file for complete search history.

(56) References Cited

U.S. PATENT DOCUMENTS

| 5,786,692 | A * | 7/1998 | Maier et al. | 324/307 |
| 7,205,763 | B2 * | 4/2007 | Porter | 324/306 |
| 7,535,222 | B2 * | 5/2009 | Bammer et al. | 324/307 |
| 7,902,825 | B2 * | 3/2011 | Bammer et al. | 324/309 |
| 7,906,965 | B2 * | 3/2011 | Koay | 324/312 |
| 2008/0157767 | A1 * | 7/2008 | Bammer et al. | 324/312 |
| 2009/0118608 | A1 * | 5/2009 | Koay | 600/410 |
| 2009/0284257 | A1 * | 11/2009 | Bammer et al. | 324/307 |
| 2010/0244834 | A1 * | 9/2010 | Mori et al. | 324/310 |
| 2010/0271021 | A1 * | 10/2010 | Liu et al. | 324/309 |

OTHER PUBLICATIONS

Michael Bock, Simultaneous T2\* and diffusion Measurements with 3He, MRM 38:890-895 (1997).

\* cited by examiner

*Primary Examiner* — Brij B Shrivastav
(74) *Attorney, Agent, or Firm* — Quarles & Brady LLP

(57) ABSTRACT

A method for measuring the apparent transverse relaxation time ("$T^*_2$") and apparent diffusion coefficient ("ADC") of a hyperpolarized gas in a single breath-hold and consequently, with a single dose of the hyperpolarized gas contrast agent, is provided. The method employs a multiple-echo projection acquisition based pulse sequence. Individual images are reconstructed from data acquired during each of the individual echo times. Subsequently, $T^*_2$ and ADC are calculated using these reconstructed images. Furthermore, the method produces images indicative of ADC that have isotropic resolution, allowing for more reliable image registration. The inter-echo spacing and diffusion weighting b-value are varied during the pulse sequence employed when practicing the present invention; thus, a significant separation between the effects of diffusion and $T^*_2$ decay on the detected MR signals is possible. This separation allows for reliable measurements of these two parameters from a single echo-train.

21 Claims, 4 Drawing Sheets

METHOD FOR SIMULTANEOUSLY MEASURING T2* AND DIFFUSION WITH MAGNETIC RESONANCE IMAGING

CROSS-REFERENCE TO RELATED APPLICATIONS

This application claims the benefit of U.S. Provisional patent application Ser. No. 61/046,817 filed on Apr. 22, 2008 and entitled "Method For Simultaneously Measuring T2* and Diffusion With Magnetic Resonance Imaging".

STATEMENT REGARDING FEDERALLY SPONSORED RESEARCH

This invention was made with United States Government support awarded by the following agency: NIH EB0002075. The United States Government has certain rights in this invention.

BACKGROUND OF THE INVENTION

The field of the invention is magnetic resonance imaging and systems. More particularly, the invention relates to methods for simultaneously measuring $T^*_2$ and diffusion of a hyperpolarized gas contrast agent.

When a substance such as human tissue is subjected to a uniform magnetic field (polarizing field $B_0$), the individual magnetic moments of the nuclei in the tissue attempt to align with this polarizing field, but precess about it in random order at their characteristic Larmor frequency. If the substance, or tissue, is subjected to a magnetic field (excitation field $B_1$) that is in the x-y plane and that is near the Larmor frequency, the net aligned moment, $M_z$, may be rotated, or "tipped", into the x-y plane to produce a net transverse magnetic moment $M_{xy}$. A signal is emitted by the excited nuclei or "spins", after the excitation signal $B_1$ is terminated, and this signal may be received and processed to form an image.

When utilizing these "MR" signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received MR signals are digitized and processed to reconstruct the image using one of many well known reconstruction techniques.

The measurement cycle used to acquire each MR signal is performed under the direction of a pulse sequence produced by a pulse sequencer. Clinically available MRI systems store a library of such pulse sequences that can be prescribed to meet the needs of many different clinical applications. Research MRI systems include a library of clinically proven pulse sequences and they also enable the development of new pulse sequences.

The MR signals acquired with an MRI system are signal samples of the subject of the examination in Fourier space, or what is often referred to in the art as "k-space". Each MR measurement cycle, or pulse sequence, typically samples a portion of k-space along a sampling trajectory characteristic of that pulse sequence. Most pulse sequences sample k-space in a raster scan-like pattern sometimes referred to as a "spin-warp", a "Fourier", a "rectilinear", or a "Cartesian" scan. The spin-warp scan technique employs a variable amplitude phase encoding magnetic field gradient pulse prior to the acquisition of MR spin-echo signals to phase encode spatial information in the direction of this gradient. In a two-dimensional implementation ("2DFT"), for example, spatial information is encoded in one direction by applying a phase encoding gradient, $G_y$, along that direction, and then a spin-echo signal is acquired in the presence of a readout magnetic field gradient, $G_x$, in a direction orthogonal to the phase encoding direction. The readout gradient present during the spin-echo acquisition encodes spatial information in the orthogonal direction. In a typical 2DFT pulse sequence, the magnitude of the phase encoding gradient pulse, $G_y$, is incremented, $\Delta G_y$, in the sequence of measurement cycles, or "views" that are acquired during the scan to produce a set of k-space MR data from which an entire image can be reconstructed.

There are many other k-space sampling patterns used by MRI systems. These include "radial", or "projection reconstruction" scans in which k-space is sampled as a set of radial sampling trajectories extending from the center of k-space. The pulse sequences for a radial scan are characterized by the lack of a phase encoding gradient and the presence of a readout gradient that changes direction from one pulse sequence view to the next. There are also many k-space sampling methods that are closely related to the radial scan and that sample along a curved k-space sampling trajectory rather than the straight line radial trajectory.

An image is reconstructed from the acquired k-space data by transforming the k-space data set to an image space data set. There are many different methods for performing this task and the method used is often determined by the technique used to acquire the k-space data. With a Cartesian grid of k-space data that results from a 2D or 3D spin-warp acquisition, for example, the most common reconstruction method used is an inverse Fourier transformation ("2DFT" or "3DFT") along each of the 2 or 3 axes of the data set. With a radial k-space data set and its variations, the most common reconstruction method includes "regridding" the k-space samples to create a Cartesian grid of k-space samples and then perform a 2DFT or 3DFT on the regridded k-space data set. In the alternative, a set of radial k-space data can also be transformed to Radon space by performing a 1DFT of each radial projection view.

Certain noble gases can be put into a hyperpolarized state and employed as contrast agents in MR imaging applications, yielding substantial SNR increases over traditional proton MR imaging methods. Imaging methods that employ noble gases in the aforementioned manner are disclosed, for example, in U.S. Pat. No. 6,426,058. Of particular interest, is the use of hyperpolarized gas for imaging the air-filled spaces within the lung. In such an imaging study, a hyperpolarized noble gas such as helium ($^3$He) or xenon ($^{129}$Xe) is inhaled into the lungs prior to the MRI scan. While the spatial resolution attainable in MR images acquired from hyperpolarized gas studies is less than conventional MR imaging techniques, the sensitivity of MRI to the diffusion of hyperpolarized gases within the lung microstructure provides a mechanism for assessing the viability of lung tissue. Using diffusion weighted MRI ("DWI"), the apparent diffusion coefficient ("ADC") of a hyperpolarized gas, such as helium-3, in the lung can be determined.

In DWI methods, motion sensitizing magnetic field gradients are applied so that the MR images include contrast related to the diffusion of water or other fluid molecules, such as hyperpolarized gas. By applying the diffusion gradients in selected directions during the MRI measurement cycle, diffusion weighted images are acquired from which the ADC is obtained for each voxel location in the reconstructed image. Hyperpolarized gas molecules diffuse less readily when they are restricted by the microstructure of the surrounding tissues. Hence, in diseases such as emphysema, which is characterized by a breakdown in the alveolar walls of the lung, measurements of the ADC of the inhaled hyperpolarized gas can be employed to assess tissue viability. Diffusion weighted MR imaging methods using hyperpolarized gas have been developed; however, the current techniques employ bipolar diffusion sensitizing gradients. Images acquired with and without these bipolar gradients present are used to determine the ADC of the gas in the lung tissues.

The apparent transverse relaxation, or $T_2^*$, for a proton species has also found use for assessing tissue viability. Mapping of $T_2^*$ for a proton spin species has been demonstrated using multi-echo projection acquisition ("PR") techniques. Also, a technique using multiple image acquisitions (each acquired in a new breath-hold and at a different echo time) has been used for $T_2^*$ mapping in the lungs using PR methods. However, this method requires multiple breath-holds and the $T_2^*$ in the lungs has been shown to be highly dependent on lung inflation volume and, therefore, repeatability between breaths.

It would therefore be desirable to provide a method that can simultaneously measure the diffusion and spin relaxation parameters of a hyperpolarized gas contrast agent. More particularly, it would be desirable to provide such a method that is applicable for a single dose of a hyperpolarized gas contrast agent and can be employed within a single breath-hold by the subject.

SUMMARY OF THE INVENTION

The present invention overcomes the drawbacks of previous methods by providing a method for imaging the apparent transverse relaxation time ("$T_2^*$") and apparent diffusion coefficient ("ADC") of a hyperpolarized gas in a single breath-hold and consequently, with a single dose of the hyperpolarized gas contrast agent.

The present invention provides a method for simultaneously imaging $T_2^*$ and the ADC in the lungs, or other airspace in the body, using a hyperpolarized gas contrast agent. The method employs a multiple-echo projection acquisition based pulse sequence. Individual images are reconstructed from data acquired during each of the individual echo times. The $T_2^*$ and ADC are then calculated using these reconstructed images. Furthermore, the present invention provides a method for producing images indicative of ADC that have isotropic resolution, allowing for more reliable image registration.

It is an aspect of the invention to provide a method that accurately measures ADC and $T_2^*$ simultaneously in one breath-hold. Because the inter-echo spacing, $TE_n$, and diffusion weighting b-value, $b_n$, are varied during the pulse sequence employed when practicing the present invention, a significant separation between the effects of diffusion and $T_2^*$ decay on the detected MR signals is possible. This separation allows for reliable measurements of these two parameters from a single echo-train. In this manner, a method for accurately measuring ADC and $T_2^*$ simultaneously in one breath-hold is provided.

The foregoing and other aspects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims and herein for interpreting the scope of the invention.

DETAILED DESCRIPTION OF THE INVENTION

Figure 1:
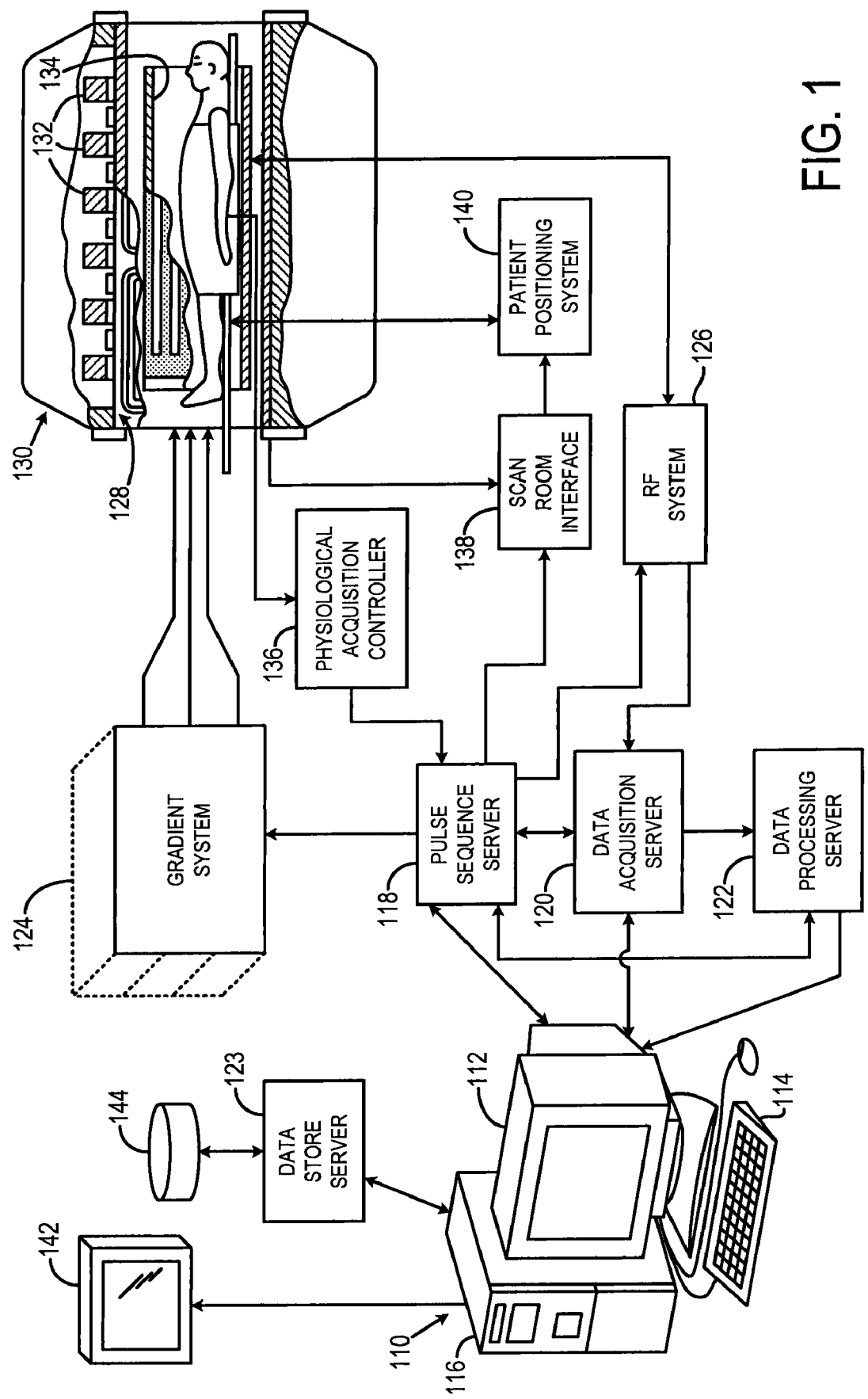
FIG. 1 is a block diagram of an MRI system that employs the present invention.

Referring particularly to FIG. 1, the preferred embodiment of the invention is employed in an MRI system. The MRI system includes a workstation 110 having a display 112 and a keyboard 114. The workstation 110 includes a processor 116 that is a commercially available programmable machine running a commercially available operating system. The workstation 110 provides the operator interface that enables scan prescriptions to be entered into the MRI system. The workstation 110 is coupled to four servers: a pulse sequence server 118; a data acquisition server 120; a data processing server 122, and a data store server 123. The workstation 110 and each server 118, 120, 122 and 123 are connected to communicate with each other.

The pulse sequence server 118 functions in response to instructions downloaded from the workstation 110 to operate a gradient system 124 and an RF system 126. Gradient waveforms necessary to perform the prescribed scan are produced and applied to the gradient system 124 that excites gradient coils in an assembly 128 to produce the magnetic field gradients $G_x$, $G_y$, and $G_x$ used for position encoding MR signals. The gradient coil assembly 128 forms part of a magnet assembly 130 that includes a polarizing magnet 132 and a whole-body RF coil 134.

RF excitation waveforms are applied to the RF coil 134 by the RF system 126 to perform the prescribed magnetic resonance pulse sequence. Responsive MR signals detected by the RF coil 134 or a separate local coil (not shown in FIG. 1) are received by the RF system 126, amplified, demodulated, filtered and digitized under direction of commands produced by the pulse sequence server 118. The RF system 126 includes an RF transmitter for producing a wide variety of RF pulses used in MR pulse sequences. The RF transmitter is responsive to the scan prescription and direction from the pulse sequence server 118 to produce RF pulses of the desired frequency, phase and pulse amplitude waveform. The generated RF pulses may be applied to the whole body RF coil 134 or to one or more local coils or coil arrays (not shown in FIG. 1).

The RF system 126 also includes one or more RF receiver channels. Each RF receiver channel includes an RF amplifier that amplifies the MR signal received by the coil to which it is connected and a detector that detects and digitizes the I and Q quadrature components of the received MR signal. The magnitude of the received MR signal may thus be determined at any sampled point by the square root of the sum of the squares of the I and Q components:

$$M = \sqrt{I^2 + Q^2},$$

and the phase of the received MR signal may also be determined:

$$\phi = \tan^{-1}\left(\frac{Q}{I}\right).$$

The pulse sequence server 118 also optionally receives patient data from a physiological acquisition controller 136. The controller 136 receives signals from a number of different sensors connected to the patient, such as ECG signals from electrodes or respiratory signals from a bellows. Such signals are typically used by the pulse sequence server 118 to synchronize, or "gate", the performance of the scan with the subject's respiration or heart beat.

The pulse sequence server 118 also connects to a scan room interface circuit 138 that receives signals from various sensors associated with the condition of the patient and the magnet system. It is also through the scan room interface circuit 138 that a patient positioning system 140 receives commands to move the patient to desired positions during the scan.

The digitized MR signal samples produced by the RF system 126 are received by the data acquisition server 120. The data acquisition server 120 operates in response to instructions downloaded from the workstation 110 to receive the real-time MR data and provide buffer storage such that no data is lost by data overrun. In some scans the data acquisition server 120 does little more than pass the acquired MR data to the data processor server 122. However, in scans that require information derived from acquired MR data to control the further performance of the scan, the data acquisition server 120 is programmed to produce such information and convey it to the pulse sequence server 118. For example, during prescans MR data is acquired and used to calibrate the pulse sequence performed by the pulse sequence server 118. Also, navigator signals may be acquired during a scan and used to adjust RF or gradient system operating parameters or to control the view order in which k-space is sampled. And, the data acquisition server 120 may be employed to process MR signals used to detect the arrival of contrast agent in a magnetic resonance angiography (MRA) scan. In all these examples the data acquisition server 120 acquires MR data and processes it in real-time to produce information that is used to control the scan.

The data processing server 122 receives MR data from the data acquisition server 120 and processes it in accordance with instructions downloaded from the workstation 110. Such processing may include, for example: Fourier transformation of raw k-space MR data to produce two or three-dimensional images; the application of filters to a reconstructed image; the performance of a backprojection image reconstruction of acquired MR data; the calculation of functional MR images; the calculation of motion or flow images, etc.

Images reconstructed by the data processing server 122 are conveyed back to the workstation 110 where they are stored. Real-time images are stored in a data base memory cache (not shown) from which they may be output to operator display 112 or a display 142 that is located near the magnet assembly 130 for use by attending physicians. Batch mode images or selected real time images are stored in a host database on disc storage 144. When such images have been reconstructed and transferred to storage, the data processing server 122 notifies the data store server 123 on the workstation 110. The workstation 110 may be used by an operator to archive the images, produce films, or send the images via a network to other facilities.

Figure 2:
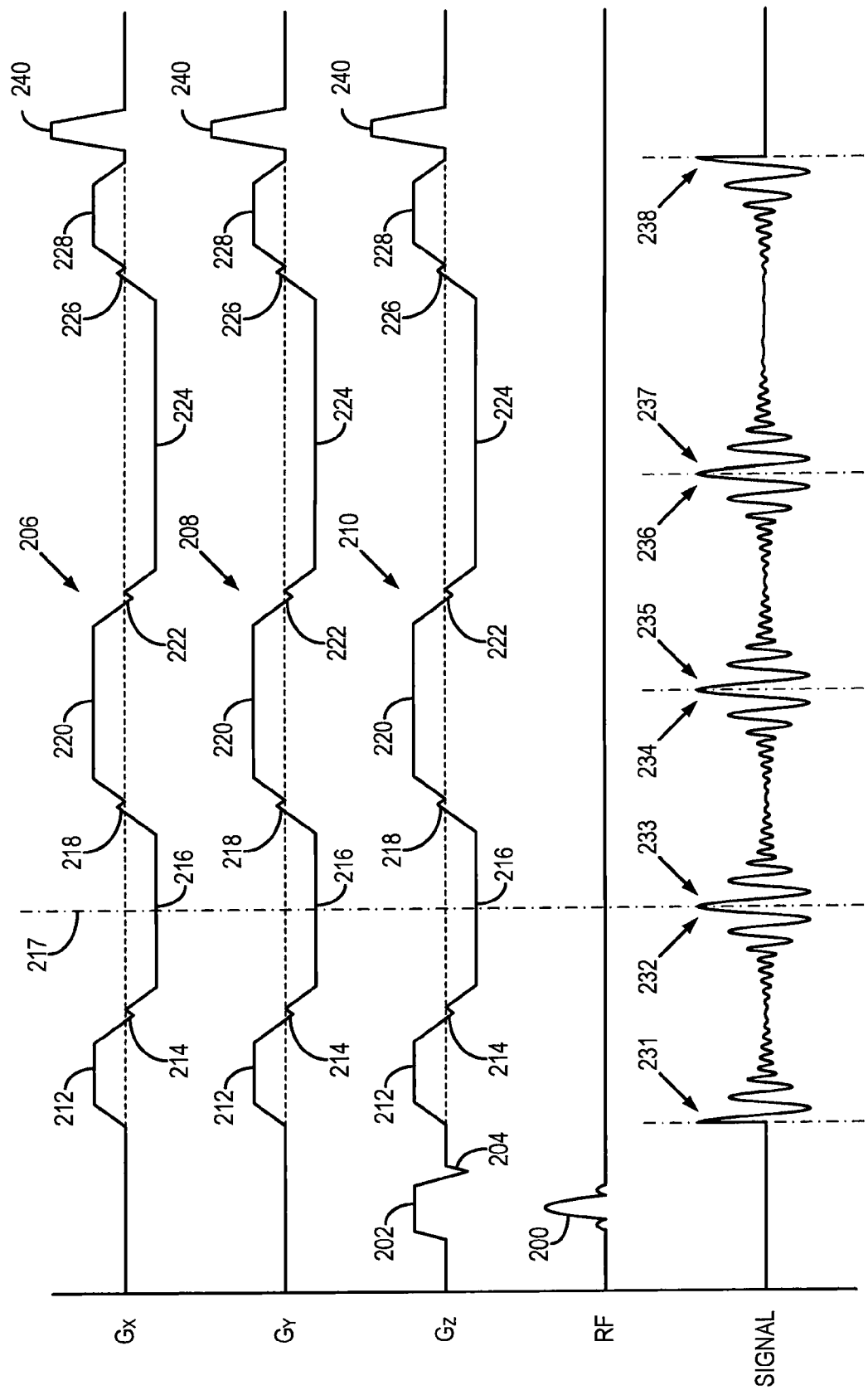
FIG. 2 is a graphic representation of an exemplary pulse sequence employed by the MRI system of FIG. 1 when practicing an embodiment of the present invention.

Referring particularly to FIG. 2, a three-dimensional ("3D") projection reconstruction pulse sequence includes three readout gradient waveforms 206, 208, and 210. Each readout gradient waveform includes an initial dephasing lobe 212 followed by three readout gradient lobes 216, 220, and 224, and then a rephasing lobe 228. First, a radiofrequency ("RF") pulse 200 is played out in the presence of a slice-selective gradient 202, such that transverse magnetization is produced in a prescribed imaging slice. The slice-selective gradient 202 includes a rephasing lobe 204 that acts to mitigate the effects of unwanted phase accruals during the application of the slice-selective gradient 202. After the application of the RF excitation pulse 200, k-space data is acquired during the entire playout of the readout gradient waveforms 206, 208, and 210. The RF excitation pulse 200 is, for example, a spectrally selective RF excitation pulse that is set to the resonance frequency of helium-3. However, it will be appreciated by those skilled in the art that the RF excitation pulse can be set to the resonance frequency of other spin species, such as that for xenon-129. A modulated flip angle is implemented to uniformly utilize the finite magnetization over each excitation such as, for example, the method described by G. W. Miller, et al., in "Hyperpolarized $^3$He Lung Ventilation Imaging with B1-Inhomogeneity Correction in a Single Breath-Hold Scan," *MAGMA*, 2004; (16):218-226.

Figure 3:
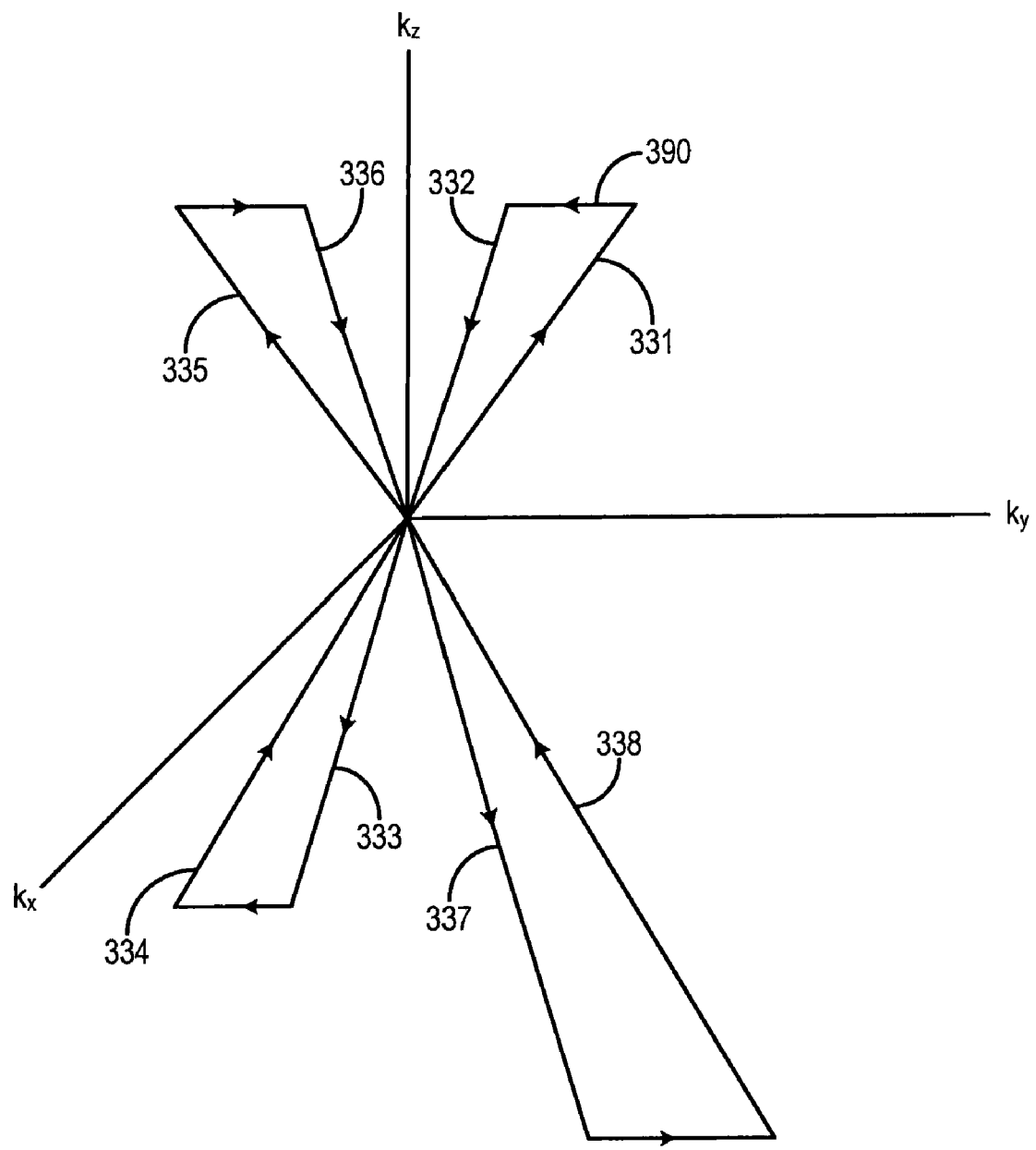
FIG. 3 is a graphic representation of the radial trajectories of k-space samples acquired with the pulse sequence of FIG. 2.

In the exemplary pulse sequence shown in FIG. 2, eight radial sampling trajectories are acquired during each repetition of the pulse sequence. Referring to FIGS. 2 and 3, during the application of dephasing lobes 212 k-space data is acquired by sampling a first half-echo 231 along a first radial trajectory 331. This sampling is radially outward from the center of k-space and it is performed during the ramps and plateau of the dephasing lobe 212. A small rotation gradient blip 214 is then applied to move the k-space sampling to another radial trajectory starting point as indicated by arrow 390. During the first half of the readout gradient lobe 216 k-space data is acquired by sampling a second half-echo 232 along a second radial trajectory 332 back to the center of k-space. At the center of the readout gradient lobe 216 indicated by dotted line 217, the level of each readout gradient $G_x$, $G_y$, and $G_z$ is changed slightly to redirect sampling to another radial direction. As a result, during the playout of the remaining half of the readout gradient lobe 216, k-space data is acquired by sampling a third half-echo 233 along a third radial sampling trajectory 333 which is directed away from the center of k-space. In this manner, k-space data is acquired during the playout of the entire readout lobe 216, including its ramps.

Referring still to FIGS. 2 and 3, prior to playing out the second readout gradient lobes 220 another small rotation gradient blip 218 is applied to move the k-space sampling to another radial trajectory. As a result, when magnetic resonance ("MR") signal acquisition is performed during the first half of readout lobe 220, a fourth k-space sampling trajectory 334 is traversed back to the center of k-space such that a fourth half-echo 234 is sampled. Similar to the playing out of the first readout lobe, 216, the level of each readout gradient $G_x$, $G_y$, and $G_z$ is changed slightly to redirect sampling to another radial direction. As a result, during the playout of the remaining half of the readout gradient lobe 220, k-space data is acquired by sampling a fifth half-echo 235 along a fifth radial sampling trajectory 335, which is directed away from the center of k-space. Prior to playing out the last readout gradient lobes 224 another small rotation gradient blip 222 is applied to move the k-space sampling to another radial trajectory. As a result, when MR signal acquisition is performed during the first portion of readout lobe 224, a sixth k-space sampling trajectory 336 is traversed back to the center of k-space such that a sixth half-echo 236 is sampled.

Again, the level of each readout gradient $G_x$, $G_y$, and $G_z$ is changed slightly to redirect sampling to another radial direction in the remainder of the readout lobe 224 to redirect sampling to another radial direction. As a result, during the playout of the remaining portion of the readout gradient lobe 224, k-space data is acquired by sampling a seventh half-echo 237 along a seventh radial sampling trajectory 337, which is directed away from the center of k-space. Prior to playing out the dephasing gradient lobe 228 another small rotation gradient blip 226 is applied to move the k-space sampling to another radial trajectory. As a result, when MR signal acquisition is performed during the dephasing lobe 228, an eighth k-space sampling trajectory 338 is traversed back to the center of k-space such that an eighth half-echo 238 is sampled. In particular, the first and second portions of the third readout gradient lobes 224 are not equal. In this manner, the second portion of the readout lobes 224 acts to impart a greater diffusion weighting to those MR signals acquired by sampling the eight half-echo 238. The increased duration of the gradients results in a larger k-space sampling radius, as shown in FIG. 3. For example, image data acquired during the non-diffusion-weighted portion of the pulse sequence are acquired with projections in k-space having a radius of 64, while the diffusion weighted image data are acquired with projections in k-space having a radius of 256.

Following the sampling of the last half-echo 238, a crusher gradient 240 is applied along each gradient axis to remove any unwanted magnetization so that signals in subsequent repetition time ("TR") periods are not contaminated by residual magnetization. At the completion of the pulse sequence, therefore, a total of eight different radial trajectories in k-space capable of creating isotropic 256×256×256 pixel images are sampled during a repetition time ("TR") period ranging, for example, from 3 to several milliseconds ("ms").

Sampling during gradient ramping is performed to reduce the echo time and improve the overall data acquisition efficiency. To combine signals from ramp samples and multiple echoes effectively and robustly, the gradients are characterized using, for example, the method proposed by J. H. Duyn, et al., in "Simple Correction Method for k-Space Trajectory Deviations in MRI," *JMR*, 1998; (132):150-153. This characterization data is used to grid the acquired data at proper k-space locations.

Figure 4:
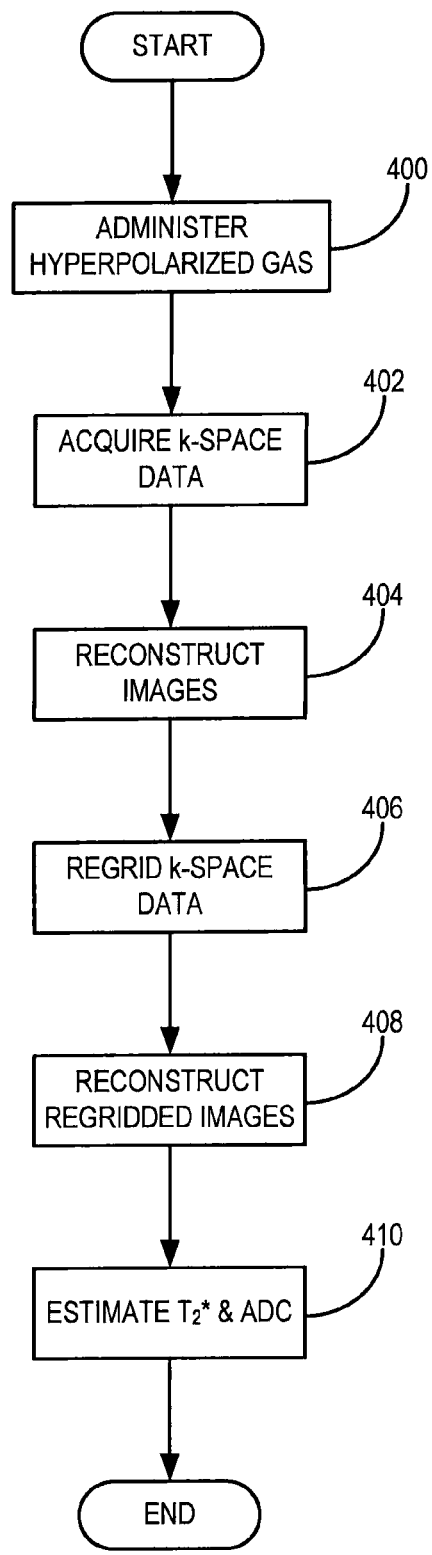
FIG. 4 is a flowchart setting forth the steps of a method for simultaneously measuring the $T_2^*$ and apparent diffusion coefficient ("ADC") of a hyperpolarized gas.

Referring particularly now to FIG. 4, a method for simultaneously measuring the ADC and $T^*_2$ of a hyperpolarized gas begins by administering the hyperpolarized gas contrast agent to a subject, as indicated in step 400. Image data is subsequently acquired using, for example, the aforementioned pulse sequence, as indicated at step 402. This acquired image, or k-space, data is then reconstructed to produce a series of images, as indicated at step 404. In general, one image is reconstructed from each set of k-space data acquired for a given half-echo, with the earlier echoes more strongly weighted towards $T^*_2$ decay. Therefore, and by way of example, eight images are reconstructed, one for each half-echo sampled by the aforementioned pulse sequence.

As discussed above, image data acquired during the non-diffusion-weighted portion of the pulse sequence is acquired with projections in k-space having a smaller sampling radius than the diffusion weighted image data. Thus, the diffusion weighted k-space data is regridded, as indicated at step 406. This regridding essentially resamples the k-space data having a larger sampling radius to projection views of the smaller k-space radius. For example, k-space data from the seventh and eighth echoes, 237 and 238, acquired using the modified eight half-echo pulse sequence above are gridded to the k-space radius of the first half-echo 231 (64 points). From the regridded k-space data, additional images are reconstructed, as indicated at step 408. These images reconstructed from the regridded data therefore exhibit greater diffusion weighting, while minimizing $T^*_2$ decay. Using these regridded images, along with the images reconstructed in step 404, the apparent diffusion coefficient ("ADC") and $T^*_2$ of the hyperpolarized gas in the subject are estimated, as indicated at step 410. A bi-exponential NMR signal model is employed to determine $T^*_2$ and the apparent diffusion coefficient ("ADC"), D. This signal model has the form:

$$S_n = S_0 e^{-D(b_n) - TE_n/T^*_2};  \quad \text{Eqn. (1)}$$

where $S_n$ is the signal acquired from the $n^{th}$ half-echo, $S_0$ is a signal acquired in the absence of diffusion weighting, D is the apparent diffusion coefficient, $b_n$ is the b-value indicative of the amount of diffusion weighting applied during the $n^{th}$ half-echo, $TE_n$ is the inter-echo spacing for the $n^{th}$ half-echo, and $T^*_2$ is the apparent transverse relaxation time. Because of the differences in the signal decay in the diffusion weighted and $T^*_2$ weighted sets of images, both ADC and $T^*_2$ measures are simultaneously estimated by fitting the logarithm of the signal decay in these images, on a voxel-by-voxel basis, to a linearized form of the signal model in Eqn. (1). This linearized signal model has the form:

$$\ln\left(\frac{S_n}{S_0}\right) = -D(b_n) - \frac{TE_n}{T^*_2}. \quad \text{Eqn. (2)}$$

As mentioned above, the linearized signal model is used to fit the logarithm of the signal decay, $\ln(S_n/S_0)$, on a voxel-by-voxel basis. From this fit, $T^*_2$ and D are determined. It should be appreciated by those skilled in the art that after $T^*_2$ and D have been estimated on a voxel-by-voxel basis that an image indicative of these parameters can subsequently be produced.

The present invention has been described in terms of one or more preferred embodiments, and it should be appreciated that many equivalents, alternatives, variations, and modifications, aside from those expressly stated, are possible and within the scope of the invention.

The invention claimed is:

1. A method for determining a spin relaxation parameter and a diffusion parameter of a hyperpolarized gas in a subject with a magnetic resonance imaging (MRI) system, the steps comprising:
    a) administering a hyperpolarized gas contrast agent to the subject;
    b) acquiring MR signal data from the subject while performing a pulse sequence with the MRI system to acquire the MR signal data along a plurality of radial k-space sampling trajectories, wherein a radius of a first subset of the radial k-space sampling trajectories is longer than a radius of a second subset of the radial k-space sampling trajectories;
    c) reconstructing images from the acquired MR signal data;
    d) determining, using the reconstructed images, a spin relaxation parameter that is indicative of the relaxation of transverse magnetization of the hyperpolarized gas in the subject; and e) determining, using the reconstructed images, a diffusion parameter that is indicative of the diffusion of the hyperpolarized gas in the subject.

2. The method as recited in claim 1 in which the spin relaxation parameter is an apparent transverse relaxation time, $T^*_2$, of the hyperpolarized gas.

3. The method as recited in claim 1 in which the diffusion parameter is an apparent diffusion coefficient of the hyperpolarized gas.

4. The method as recited in claim 1 in which steps d) and e) are performed substantially contemporaneously.

5. The method as recited in claim 1 in which steps d) and e) include fitting voxel values in the reconstructed images to a model indicative of a magnetic resonance signal.

6. A method for determining a spin relaxation parameter and a diffusion parameter of a hyperpolarized gas in a subject with a magnetic resonance imaging (MRI) system, the steps comprising:
  a) administering a hyperpolarized gas contrast agent to the subject;
  b) acquiring MR signal data from the subject while performing a pulse sequence with the MRI system;
  c) reconstructing images from the acquired MR signal data;
  d) determining, using the reconstructed images, a spin relaxation parameter that is indicative of the relaxation of transverse magnetization of the hyperpolarized gas in the subject;
  e) determining, using the reconstructed images, a diffusion parameter that is indicative of the diffusion of the hyperpolarized gas in the subject; and
  in which the pulse sequence performed in step b) includes:
    i) a first data acquisition portion during which non-diffusion weighted MR signal data is acquired; and
    ii) a second data acquisition portion during which diffusion weighted MR signal data is acquired.

7. The method as recited in claim 6 in which the diffusion weighted MR signal data is acquired with a sampling pattern different than the non-diffusion weighted MR signal data.

8. The method as recited in claim 7 in which step c) includes:
  i) regridding the diffusion weighted MR signal data to the same sampling pattern as the non-diffusion weighted MR signal data; and
  ii) reconstructing diffusion weighted images from the regridded MR signal data.

9. The method as recited in claim 6 in which the first and second data acquisition portions include acquiring MR signal data from a plurality of half-echoes.

10. The method as recited in claim 9 in which a diffusion sensitizing gradient is played out before the second data acquisition period such that MR signals are sensitized to diffusion.

11. The method as recited in claim 9 in which steps d) and e) include fitting voxel values in the reconstructed images to a linear signal model having the form:

$$\ln\left(\frac{S_n}{S_0}\right) = -D(b_n) - \frac{TE_n}{T_2^*};$$

wherein:
  $S_n$ is a signal acquired from an $n^{th}$ half-echo;
  $S_0$ is a signal acquired in the absence of diffusion weighting;
  D is an apparent diffusion coefficient;
  $b_n$ is a b-value indicative of the amount of diffusion weighting applied during the $n^{th}$ half-echo;
  $TE_n$ is an inter-echo spacing for the $n^{th}$ half-echo; and
  $T^*_2$ is an apparent transverse relaxation time.

12. A method for simultaneously determining a spin relaxation parameter and a diffusion parameter in a subject with a magnetic resonance imaging (MRI) system, the steps comprising:
  a) performing a pulse sequence with the MRI system to:
    i) acquire a set of non-diffusion weighted MR signal data from the subject using a first series of trajectories that sample k-space up to a first k-space radius; and
    ii) acquire a set of diffusion weighted MR signal data from the subject using a second series of trajectories that sample k-space up to a second k-space radius that is larger than the first k-space radius;
  b) reconstructing a set of non-diffusion weighted images from the acquired non-diffusion weighted MR signal data;
  c) reconstructing a set of diffusion weighted images from the acquired set of diffusion weighted MR signal data;
  d) determining, using the reconstructed non-diffusion weighted images, a spin relaxation parameter that is indicative of the relaxation of transverse magnetization in the subject; and
  e) determining, using the reconstructed diffusion weighted images, a diffusion parameter that is indicative of the diffusion of a spin species.

13. The method as recited in claim 12 in which step a) includes administering a hyperpolarized gas contrast agent to the subject prior to performing the pulse sequence.

14. The method as recited in claim 13 in which the spin relaxation parameter is an apparent transverse relaxation time, $T^*_2$, of the hyperpolarized gas.

15. The method as recited in claim 13 in which the diffusion parameter is an apparent diffusion coefficient of the hyperpolarized gas indicative of the diffusion of the hyperpolarized gas in the subject.

16. The method as recited in claim 12 in which the non-diffusion weighted and diffusion weighted MR signal data sets are acquired by sampling a plurality of half-echoes.

17. The method as recited in claim 16 in which the plurality of half-echoes are sampled with at least one of a radial and a spiral k-space sampling pattern.

18. The method as recited in claim 12 in which step c) includes regridding the diffusion weighted MR signal data to the same sampling pattern as the non-diffusion weighted MR signal data.

19. The method as recited in claim 12 in which:
  step d) includes fitting voxel values in the reconstructed non-diffusion weighted images to a linear signal model; and
  step e) includes fitting voxel values in the reconstructed diffusion weighted images to a linear signal model.

20. The method as recited in claim 19 in which the linear signal model has the form:

$$\ln\left(\frac{S_n}{S_0}\right) = -D(b_n) - \frac{TE_n}{T_2^*};$$

wherein:
  $S_n$ is a signal acquired from an $n^{th}$ half-echo;
  $S_0$ is a signal acquired in the absence of diffusion weighting;
  D is an apparent diffusion coefficient;
  $b_n$ is a b-value indicative of the amount of diffusion weighting applied during the $n^{th}$ half-echo;
  $TE_n$ is an inter-echo spacing for the $n^{th}$ half-echo; and
  $T^*_2$ is an apparent transverse relaxation time.

21. The method as recited in claim 1 in which the first subset of radial sampling trajectories corresponds to acquired diffusion-weighted data and the second subset of radial sampling trajectories corresponds to acquired non-diffusion-weighted data of the acquired MR signal data.

* * * * *